(12) United States Patent
Hirose et al.

(10) Patent No.: US 9,053,834 B2
(45) Date of Patent: Jun. 9, 2015

(54) SILICON CARBIDE SINGLE CRYSTAL AND MANUFACTURING METHOD OF THE SAME

(75) Inventors: Fusao Hirose, Obu (JP); Jun Kojima, Iwakura (JP); Kazutoshi Kojima, Tsukuba (JP); Tomohisa Kato, Tsukuba (JP); Ayumu Adachi, Toyota (JP); Koichi Nishikawa, Nagoya (JP)

(73) Assignees: DENSO CORPORATION, Kariya (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 902 days.

(21) Appl. No.: 13/194,621

(22) Filed: Jul. 29, 2011

(65) Prior Publication Data

US 2012/0025153 A1    Feb. 2, 2012

(30) Foreign Application Priority Data

Jul. 30, 2010   (JP) ................ 2010-172287

(51) Int. Cl.
| | |
|---|---|
| *H01B 1/04* | (2006.01) |
| *C30B 31/00* | (2006.01) |
| *C30B 29/36* | (2006.01) |
| *C30B 23/02* | (2006.01) |
| *C30B 23/00* | (2006.01) |

(52) U.S. Cl.
CPC *H01B 1/04* (2013.01); *C30B 31/00* (2013.01); *C30B 23/02* (2013.01); *C30B 29/36* (2013.01); *C30B 23/00* (2013.01)

(58) Field of Classification Search
CPC .......... H01B 1/04; C30B 29/36; C30B 31/00; H01L 21/02378; H01L 29/1608; C01B 31/36
USPC ................ 252/516; 257/77; 438/16; 423/13; 428/446
See application file for complete search history.

(56) References Cited

U.S. PATENT DOCUMENTS

| | | | |
|---|---|---|---|
| 6,200,917 B1 * | 3/2001 | Carter et al. ................ | 501/86 |
| 7,972,704 B2 * | 7/2011 | Ohtani et al. .............. | 428/446 |
| 2002/0104478 A1 | 8/2002 | Oguri et al. | |
| 2009/0302326 A1 | 12/2009 | Maruyama | |
| 2010/0080956 A1 | 4/2010 | Fujimoto et al. | |
| 2010/0289033 A1 * | 11/2010 | Ohtani et al. .............. | 257/77 |

FOREIGN PATENT DOCUMENTS

| | | |
|---|---|---|
| JP | A-10-017399 | 1/1998 |
| JP | A-2004-335720 | 11/2004 |
| JP | A-2009-167047 | 7/2009 |
| JP | A-2012-030994 | 2/2012 |
| WO | WO2009091067 | * 7/2009 |

OTHER PUBLICATIONS

Agarwal et al "Influence of basal plane dislocation induced stacking faults . . . ", Mat. Sci. Forum vols. 527-529 (2006) Abstract.*

(Continued)

*Primary Examiner* — Mark Kopec
(74) *Attorney, Agent, or Firm* — Posz Law Group, PLC

(57) ABSTRACT

A silicon carbide single crystal includes nitrogen as a dopant and aluminum as a dopant. A nitrogen concentration is $2 \times 10^{19}$ cm$^{-3}$ or higher and a ratio of an aluminum concentration to the nitrogen concentration is within a range of 5% to 40%.

8 Claims, 3 Drawing Sheets

(56) References Cited

OTHER PUBLICATIONS

Ha et al "Nucleation sites of recombination-enhanced stacking fault formation in silicon carbide p-i-n. diodes", Journal Applied Physics, 96(1) (2004) p. 393-398.*

Zhang et al "Mechanism of elimating basal plance dislocations in SiC thin films . . . ", Applied Physics Lett, 89, 081910 (2006).*

Office Action dated Mar. 18, 2014 issued in corresponding CN Application No. 201110220363.2 (and English translation).

Office Action issued in the CN Application No. 201110220363.2 dated Oct. 12, 2013 (English translation).

"Diffusion of Nitrogen Into Silicon Carbide Single Crystals Doped With Aluminum" by L.J. Kroko, Solid-State Electronics, vol. 9, Issues 11-2, Nov.-Dec. 1966 pp. 1125-1130.

"Diffusion of Nitrogen Into Silicon Carbide Single Crystals Doped With Aluminum" by L.J. Kroko, Solid-State Electronics, vol. 9, Issues 11-12, Nov.-Dec. 1966 pp. 1125-1134.

Office Action mailed Nov. 26, 2013 in corresponding JP Application No. 2010-172287 (with English translation).

Office Action dated Jun. 27, 2014 issued in corresponding CN Application No. 201110220363.2 (and English translation).

Office Action dated Aug. 9, 2012 in DE Application No. 102011079855.2.

Office Action mailed Sep. 24, 2014 issued in corresponding JP Application No. 2010-172287 (and English translation).

Examination Report issued in the corresponding German application No. 10 2011 079 855.2 (and English translation).

\* cited by examiner

SILICON CARBIDE SINGLE CRYSTAL AND MANUFACTURING METHOD OF THE SAME

CROSS REFERENCE TO RELATED APPLICATION

This application is based on Japanese Patent Application No. 2010-172287 filed on Jul. 30, 2010, the disclosure of which is incorporated herein by reference.

FIELD OF THE INVENTION

The present invention relates to a silicon carbide (hereafter referred to as SiC) single crystal. The present invention also relates to a method of manufacturing a SiC single crystal and a method of manufacturing a SiC single crystal substrate.

BACKGROUND OF THE INVENTION

In recent years, SiC has attracted attention as a material of power devices that can provide a high breakdown field intensity. SiC semiconductor devices can be used in controlling high current because the SiC semiconductor devices have high field intensity. Therefore, SiC is expected to be applied in control of motors for hybrid cars.

When such SiC semiconductor devices are manufactured, a SiC single crystal wafer is used or a SiC single crystal layer doped with impurities is grown on a SiC single crystal substrate. At this time, for example, to obtain an n-type SiC single crystal having low resistance, nitrogen is required to be doped heavily as an n-type dopant. Specifically, a specific resistance demanded for devices is a few mΩcm and nitrogen should be doped heavily to reach this value.

However, it is confirmed that when nitrogen is doped to a SiC single crystal to reduce a resistance, stacking faults are generated easily if a concentration of nitrogen is $2\times10^{19}$ cm$^{-3}$ or higher. In a case where nitrogen is doped at $2\times10^{19}$ cm$^{-3}$, the specific resistance of a device is about 10 mΩcm and is a few times higher than the specific resistance demanded for devices. The specific resistance of devices decreases by doping more nitrogen, however, stacking faults increase substantially to about 800 to 1000 cm$^{-1}$. The stacking faults become a leak current source or a resistance component in the manufactured devices and cause a negative effect on electric characteristics of the devices, so it is not just a matter of doping nitrogen.

JP-A-2008-290898 (corresponding to US 2010/0080956 A1) discloses a method to reduce generation of stacking faults during a heat treatment of a SiC single crystal substrate having low resistance. Specifically, 90% or greater of the whole surface of the SiC single crystal substrate is covered by a SiC single crystal plane having surface roughness (Ra) of 1.9 nm or less. Stacking faults are generated during the heat treatment which is performed in a case where a concentration of impurities is increased to reduce the resistance. The generated amount of stacking faults increases with an increase in the surface roughness. Therefore, in order to inhibit an increase in the generated amount of stacking faults, the surface of the SiC single crystal substrate is covered by a SiC single crystal plane having a small surface roughness so that a crystal defect is difficult to generate.

JP-A-10-017399 suggests a manufacturing method of 6H—SiC single crystal in which generation of a micropipe defect is prevented and the amount of stacking faults is small. Specifically, in a sublimation recrystallization method, a plane of a 6H—SiC that is inclined at an angle within ±30 degrees from a (11-20) plane toward a (0001) plane and is inclined at an angle within ±10 degrees from the (11-20) plane toward a (10-10) plane is used as a seed crystal substrate.

Although JP-A-2008-290898 suggests the method for inhibiting generation of stacking faults during the heat treatment, stacking faults are already generated during doping a great amount of nitrogen prior to the heat treatment. Therefore, the method has no effects unless the stacking faults are inhibited from a step of doping. In JP-A-10-017399, SiC of a specific polymorphism having a small amount of stacking faults is manufactured by using a specific plane direction as a growth face. However, the direction of the growth face is specified and the polymorphism of the manufactured SiC is also specified. Therefore, SiC single crystal having a small amount of stacking faults can be manufactured only in a limited way. In addition, it is not clear whether the generated amount of stacking faults can be reduced to a level that the stacking faults do not cause negative effects on electric characteristics of devices in a case where the doped amount is increased to reduce the resistance. Accordingly, a manufacturing method to reduce a specific resistance and to reduce generation of stacking faults is required.

SUMMARY OF THE INVENTION

In view of the foregoing problems, it is a first object of the present invention to provide a SiC single crystal in which specific resistance can be reduced and the amount of stacking faults can be reduced. A second object is to provide a method of manufacturing a SiC single crystal and a third object is to provide a method of manufacturing a SiC single crystal substrate.

According to a first aspect of the present disclosure, a SiC single crystal includes nitrogen as a dopant and aluminum as a dopant, a nitrogen concentration is $2\times10^{19}$ cm$^{-3}$ or higher and a ratio of an aluminum concentration to the nitrogen concentration is within a range of 5% to 40%.

In the above SiC single crystal, since nitrogen and aluminum is doped concurrently at a predetermined nitrogen concentration and a predetermined Al/N ratio, specific resistance can be reduced and also the amount of stacking faults can be reduced.

According to a second aspect of the present disclosure, a method of manufacturing a SiC single crystal includes growing a SiC single crystal on a surface of a SiC single crystal substrate used as a seed crystal by supplying sublimed gas of a SiC source material to the surface of the SiC single crystal substrate. The growing the SiC single crystal includes doping nitrogen and aluminum concurrently, a nitrogen concentration is $2\times10^{19}$ cm$^{-3}$ or higher and a ratio of an aluminum concentration to the nitrogen concentration is within a range of 5% to 40%.

By the method according to the second aspect, the SiC single crystal according to the first aspect can be manufactured.

According to a third aspect of the present disclosure, a method of manufacturing a SiC single crystal substrate includes forming a SiC single crystal substrate by cutting the SiC single crystal manufactured by the method according to the second aspect.

The SiC single crystal substrate manufactured by the third aspect can be used as a seed crystal for growing a SiC single crystal.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

A first embodiment of the present invention will be described with reference to FIG. 1.

Figure 1:
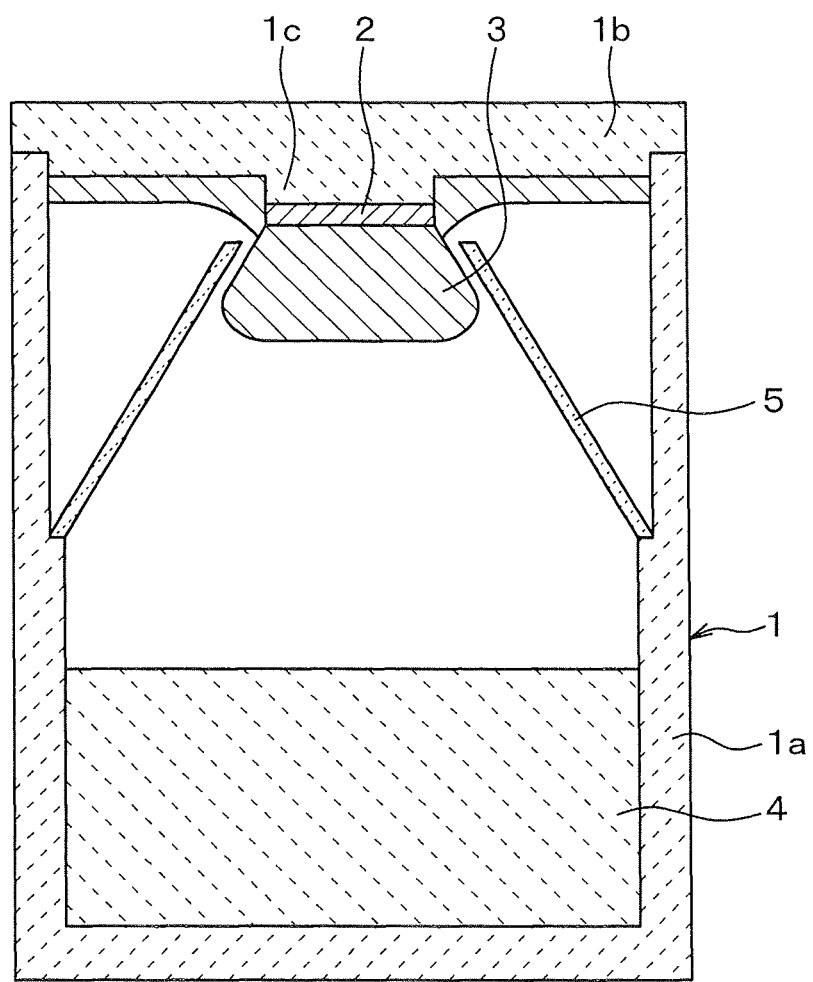
FIG. 1 is a diagrammatic cross-sectional view showing a state where a SiC single crystal is grown with a SiC single crystal growth apparatus according to a first embodiment of the present invention.

The SiC single crystal manufacturing apparatus shown in FIG. 1 is an apparatus in which a SiC single crystal can be grown by an advanced Rayleigh method. The SiC single crystal manufacturing apparatus has a graphite crucible 1 including a hollow cylindrical crucible body is with a bottom and a circular lid 1b. A portion protruding from a center portion of a rear surface of the lid 1b is a pedestal 1c, and the SiC single crystal substrate 2 used as a seed crystal is attached on the surface of the pedestal 1c through, for example, adhesive so that the SiC single crystal 3 can be grown on the surface of the SiC single crystal substrate 2.

A plane, for example, having an off angle within a range from 1 degree to 15 degrees toward the (0001) C plane is used as a SiC single crystal substrate 2. The pedestal 1c on which the SiC single crystal substrate 2 is attached has nearly the same size with the SiC single crystal substrate 2. In the present embodiment, the SiC single crystal substrate 2 has a circular shape and also the pedestal 1c has the same circular shape with the SiC single crystal substrate 2. Additionally, the center of the pedestal 1c is disposed right above the central axis of the crucible 1 so that the center of the SiC single crystal substrate 2 is also disposed right above the central axis of the crucible 1. Furthermore, the SiC single crystal substrate 2 and the pedestal 1c can have any shapes, not limited to circles but may be squares, hexagons, octagons or other polygonal shapes.

A ring member 5 having a skirt-like shape, specifically, having a hollow circular truncated cone shape is fixed to the lid 1b of the crucible 1 in such a manner that the ring member 5 surrounds the pedestal 1c. One end of the ring member 5 is disposed on an uneven portion formed on an inner wall of the crucible body 1a, and a diameter of a growth space gradually increases from the SiC single crystal substrate 2 in a growth direction. The ring member 5 can reduce a radial temperature distribution in the vicinity of the SiC single crystal substrate 2 and equalize a temperature in the growth space of the SiC single crystal 3 that is grown on the surface of the SiC single crystal substrate 2. In addition, due to the ring member 5, a temperature of the SiC single crystal substrate 2 and a temperature of a growth face of the SiC single crystal 3 are lower than other portions.

In the crucible body 1a, raw material 4 that provides source material of sublimated gas and includes SiC source powder and aluminum (Al) material is disposed. For example, SiC and mixed powder of Si and C having predetermined particle diameters can be used as SiC source powder included in the raw material 4, also $Si_2C$ or $SiC_2$ having predetermined particle diameters can be used as SiC source powder included in the raw material 4. Any material including Al can be used as Al material included in the raw material 4. Material including Al and being free of elements other than constituent element of SiC and constituent element of dopant such as $Al_4C_3$ and AlN may be used as Al material.

Additionally, the crucible 1 is mounted on a rotator which is not shown in the figure. The rotator rotates around the central axis of the crucible 1, so when the rotator rotates, the crucible 1 mounted on the rotator also rotates around the central axis of the crucible 1. Accordingly, the SiC single crystal substrate 2 attached to the pedestal 1c can rotate around the central axis of the crucible 1.

Furthermore, a heating apparatus, which is not shown in the figure, such as a heater is disposed outside the crucible 1 so as to surround the crucible 1. The temperature in the crucible 1 can be adjusted to an appropriate level by controlling the power of the heating apparatus. For example, when the SiC single crystal 3 is grown, the temperature of the SiC single crystal substrate 2 used as the seed crystal can be maintained a temperature lower than the temperature of the raw material 4 including the SiC source powder by 10° C. to 200° C. by controlling the power of the heating apparatus. Also it is not shown in the figure, the crucible 1 and other parts are housed in a vacuum chamber in which argon gas and nitrogen (N) used as a dopant can be introduced and the whole parts can be heated in the vacuum chamber.

The SiC single crystal 3 is grown on the growth face of the SiC single crystal substrate in the growth space between the SiC single crystal substrate 2 used as the seed crystal and the raw material 4 in the crucible 1, specifically, the space surrounded by the ring member 5 having the skirt-like shape by recrystallization of the vapor gas sublimated from the SiC source powder included in the raw material 4 on the surface of the SiC single crystal substrate 2 with the SiC single crystal manufacturing apparatus having the above-described structure. An ingot of the SiC single crystal 3 doped with both nitrogen and Al can be manufactured by supplying nitrogen used as the dopant during the growth of SiC single crystal 3 so that nitrogen is doped in the SiC single crystal 3 at a high concentration, and gasifying the Al material concurrently in growing the SiC single crystal 3.

Details of a manufacturing method of the SiC single crystal 3 manufactured with the above-described SiC single crystal manufacturing apparatus will be described.

Firstly, a mixture of SiC source powder and Al material such as $Al_4C_3$ powder or AlN powder is disposed in the crucible body 1a as the raw material 4. In addition, the lid 1b is disposed on the crucible body is after the SiC single crystal substrate 2 used as the seed crystal is attached to the pedestal 1c which is located on the rear surface of the lid 1b. Then argon gas used as growth atmosphere and nitrogen gas used as nitrogen dopant source are introduced into the vacuum chamber concurrently. Then the temperature in the vicinity of the raw material 4 is set to be higher than the sublimation temperature of the SiC source powder and the temperature in the vicinity of the SiC single crystal substrate 2 used as the seed crystal is set to be lower than the temperature of the raw material 4 by 10° C. to 200° C. by controlling the power of the heating apparatus. Accordingly, the SiC single crystal 3 doped with both nitrogen and Al can be grown.

During the doping, the concentration of nitrogen doped in the SiC single crystal 3 is set to $2 \times 10^{19}$ $cm^{-3}$ or higher. Additionally, the ratio of the Al concentration to the nitrogen concentration (hereafter referred to as Al/N ratio) is controlled to within a range of 5% to 40%. The Al/N ratio may also be within a range of 10% to 40%, and the Al/N ratio may also be within a range of 15% to 40%. The reasons will be explained with reference to FIG. 2 and FIG. 3.

Figure 2:
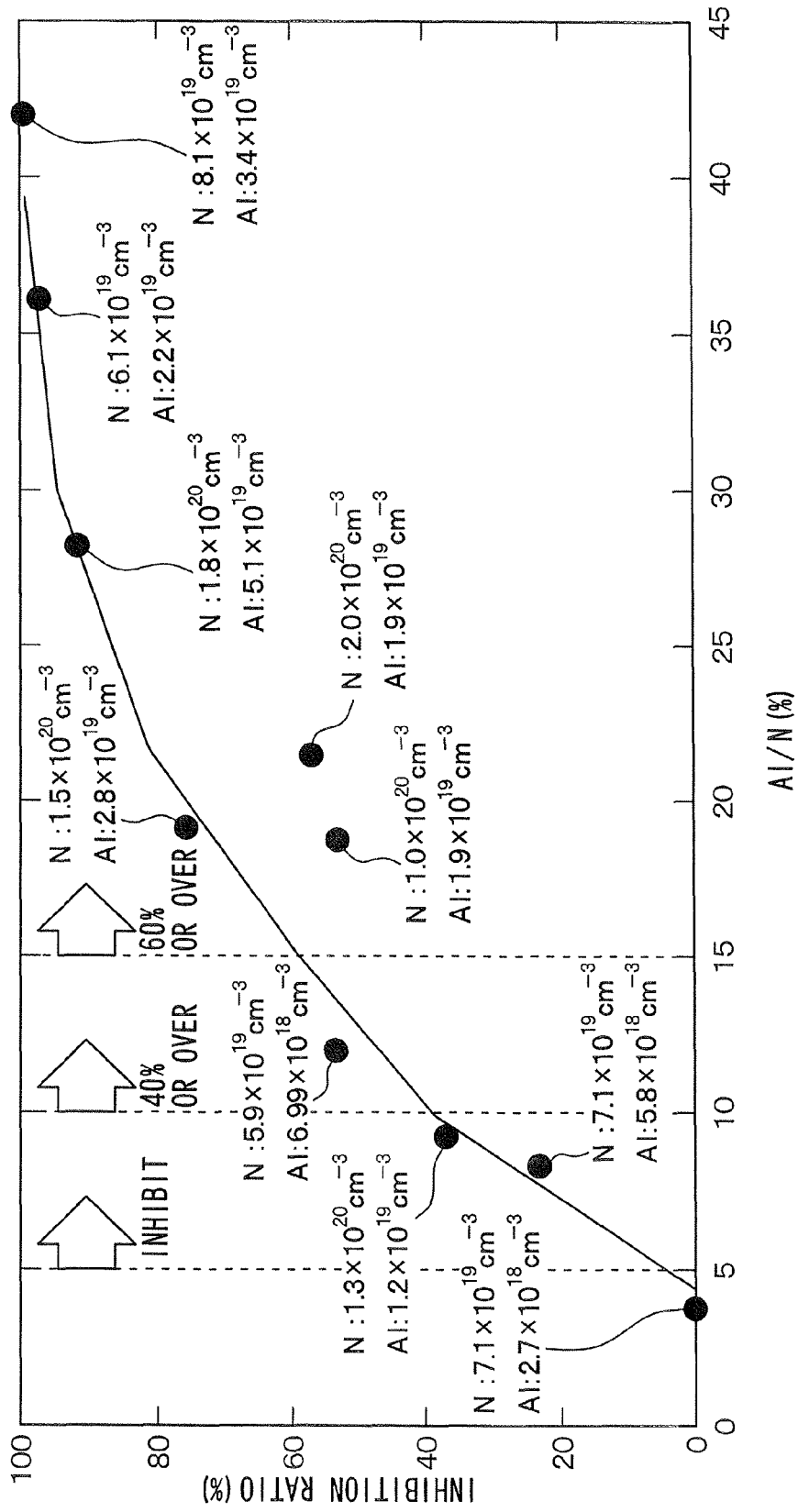
FIG. 2 is a graph showing a relationship between an Al/N ratio and an inhibition ratio of stacking faults.

In FIG. 2, an inhibition ratio of stacking faults means a ratio of a stacking fault density in a case where the Al is doped to a stacking fault density in a case where the Al is not doped under the condition that the nitrogen concentration is the same.

The inhibition ratios of stacking faults increase with an increase in the Al/N ratio as shown in FIG. 2, which means that the stacking faults can be inhibited by doping Al with a ratio higher than a predetermined level during doping nitrogen, and the inhibition effect substantially increases with an increase in the doped amount of Al. According to experimental results, in a case where the Al/N ratio is 5% or higher, the inhibition effect to stacking faults is started to be achieved, in a case where the Al/N ratio is 10% or higher, the inhibition ratio can be a high level of 40% or higher and in a case where the Al/N ratio is 15% or higher, the inhibition ratio can be a very high level of 60% or higher.

Accordingly, stacking faults can be reduced by doping Al and nitrogen concurrently compared with a case where Al is not doped. Although the mechanism is uncertain, the mechanism is presumed as follows.

Carbon in the SiC single crystal 3 is replaced by nitrogen. Because nitrogen has a smaller atomic radius than an atomic radius of silicon (Si), replacement of carbon by nitrogen causes a compression effect to the crystal. The compression effect increases with an increase in the doped amount of nitrogen and causes a distortion in the atomic arrangement; as a result, stacking faults are generated to keep the stability of the crystal. Therefore, the compression effect can be compensated by an expansion effect caused by replacement of silicon by Al having a larger atomic radius than the atomic radius of silicon by doping Al, and generation of the stacking faults can be inhibited.

Accordingly, in a case where the nitrogen is doped to the SiC single crystal 3 at a concentration of $2 \times 10^{19}$ cm$^{-3}$ or higher, the stacking faults of the SiC single crystal 3 can be reduced by doping Al with nitrogen concurrently with the Al/N ratio of 5% or higher. The Al/N ratio may also be 10% or higher, and the Al/N ratio may also be 15% or higher.

Figure 3:
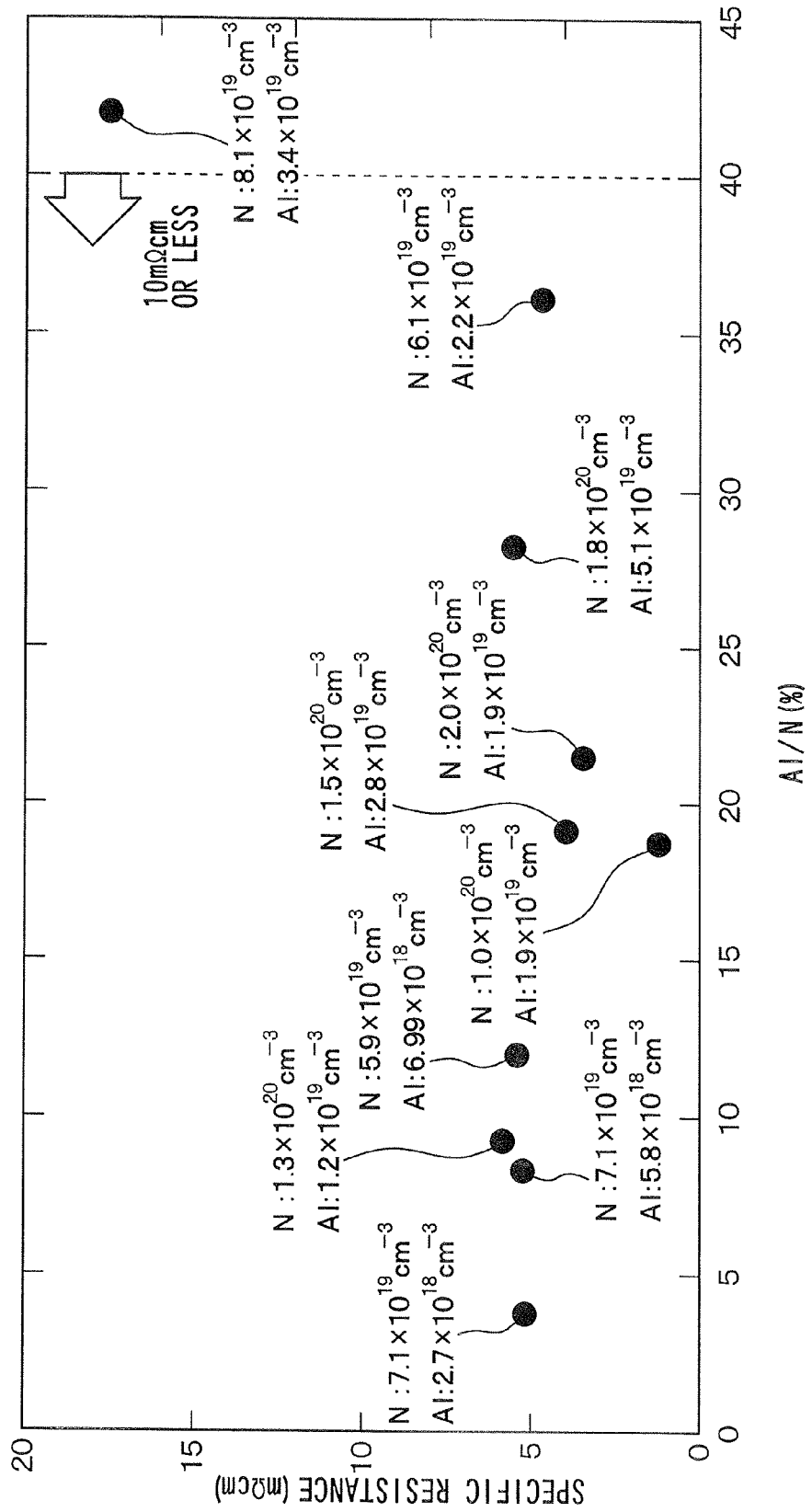
FIG. 3 is a graph showing a relationship between an Al/N ratio and a specific resistance.

However, the specific resistance (mΩcm) increases drastically when the Al/N ratio is increased too high as shown in FIG. 3. Specifically, the specific resistance becomes as high as about 17 mΩcm in a case where the Al/N ratio is 42%. According to experimental results, the specific resistance increases to 10 mΩcm or higher in a case where the Al/N ratio is 40% or higher, and the specific resistance in a case where the Al/N ratio is 40% or higher is a few times higher than the specific resistance in a case where the Al/N ratio is 40% or lower. Therefore, generation of stacking faults can be inhibited and the specific resistance can be reduced by doping nitrogen and Al concurrently at an Al/N ratio within a range from 5% to 40%. The stacking faults can be inhibited more certainly in a case where the Al/N ratio is controlled to a ratio within a range from 10% to 40% or a ratio within a range from 15% to 40%.

With reference to foregoing findings, in a case where nitrogen is doped to the SiC single crystal 3, and the concentration of nitrogen is $2 \times 10^{19}$ cm$^{-3}$ or higher, various conditions are set so that the Al/N ratio is within the above-described value range. For example, when the SiC single crystal 3 is grown by the manufacturing apparatus of a SiC single crystal, a mixture of Al material and SiC source powder in which the ratio of the Al material to the SiC source powder is 45% is used as the raw material 4. In addition, when the mixture of argon gas used as the growth atmosphere and nitrogen gas used as dopant is introduced into the vacuum chamber, the nitrogen gas is mixed with a ratio of 14% to the argon gas. Then the temperature in the vicinity of the raw material 4 is set to approximately 2400° C. and the temperature in the vicinity of the SiC single crystal substrate 2 used as the seed crystal is set to approximately 2200° C. and the growth pressure is set to 1.3 kPa by controlling the power of the heating apparatus and the growth of SiC single crystal 3 is carried out for 100 hours.

The nitrogen concentration and the Al concentration of the SiC single crystal 3 grown in above-described conditions are respectively $4 \times 10^{19}$ cm$^{-3}$ and $8 \times 10^{18}$ cm$^{-3}$ and the Al/N ratio is 20%. Additionally, the specific resistance is 6 mΩcm. Furthermore, when the SiC single crystal 3 is cut out at an off angle of 4 degrees, and an etch pit density of stacking faults is measured with molten KOH etching, the etch pit density is 45 cm$^{-1}$. When the density of stacking faults generated in a SiC single crystal doped with only nitrogen is measured with the same method, the etch pit density is 250 cm$^{-1}$, therefore the stacking faults can be reduced by nearly 80% by doping Al.

As described above, in a case where the nitrogen is doped to the SiC single crystal 3 at a concentration of $2 \times 10^{19}$ cm$^{-3}$ or higher, the stacking faults of SiC single crystal 3 can be reduced by doping Al concurrently with nitrogen with the Al/N ratio of 5% or higher. The Al/N ratio may also be 10% or higher, and the Al/N ratio may also be 15% or higher. Additionally, the specific resistance can be reduced by controlling the Al/N ratio to 40% or lower and a specific resistance demanded for devices can be obtained. Accordingly, the SiC single crystal 3, in which a specific resistance demanded for devices can be obtained and the amount of stacking faults can be reduced, can be obtained.

A SiC single crystal substrate with a surface of predetermined plane direction having small amount of stacking faults and low specific resistance can be obtained by cutting the SiC single crystal 3 manufactured by the above-described manufacturing method along the predetermined plane direction. When a device is formed of the above-described SiC single crystal substrate, negative effects on electric characteristics of the device are restricted, and high characteristic performances is obtained. Additionally, the SiC single crystal substrate obtained by the above-described way can be also used as a new seed crystal to grow a SiC single crystal. Because the SiC single crystal having small amount of stacking faults is used as a seed crystal, a SiC single crystal having small amount of stacking faults and high characteristic performances can be grown again.

JP-A-2009-167047 (corresponding to US 2010/0289033 A1) discloses a manufacturing method of a SiC single crystal. In the manufacturing method, when a SiC single crystal ingot is formed, donor-type impurity is doped at a concentration of $2 \times 10^{18}$ cm$^{-3}$ to $6 \times 10^{20}$ cm$^{-3}$, acceptor-type impurity is doped at a concentration of $1 \times 10^{18}$ cm$^{-3}$ to $5.99 \times 10^{20}$ cm$^{-3}$, the concentration of the donor-type impurity is greater than the concentration of the acceptor-type impurity, and the difference is $1 \times 10^{18}$ cm$^{-3}$ to $5.99 \times 10^{20}$ cm$^{-3}$ so as to reduce basal surface dislocations in the SiC single crystal. That is, the basal surface dislocations of the SiC single crystal can be reduced by doping the donor-type impurity and the acceptor-type impurity concurrently during the growth of the SiC single crystal.

However, the invention in this patent document only aims to reduce the basal surface dislocations and has no regard to the stacking faults. Stacking faults are different from basal surface dislocations in configuration and can not be reduced only by doping the donor-type impurity and the acceptor-type impurity concurrently. Accordingly, in a case where a SiC single crystal is grown under the conditions described in this patent document, generation of stacking faults can not be inhibited and the specific resistance can not be reduced as shown in the present embodiment.

Second Embodiment

A second embodiment of the present invention will be described. Because, in the present embodiment, a manufacturing method of a SiC single crystal 3 is changed from the first embodiment and the other is similar to the first embodiment, only different part will be described.

The method of growing the SiC single crystal 3 by the advanced Rayleigh method is described in the first embodiment; however, the SiC single crystal 3 can be also grown by a deposition method. The manufacturing apparatus of a SiC single crystal by the deposition method is a commonly known technology and is not shown by figure. In the manufacturing apparatus, a reaction crucible having a cylindrical shape with a lid and made of graphite is disposed in a quartz vacuum chamber. The SiC single crystal substrate 2 used as a seed crystal is attached to a rear surface of the lid which is disposed at a top end of the reaction crucible. Source gas and carrier gas are introduced into the reaction crucible through an inlet disposed at a bottom of the reaction crucible. In this way, the SiC single crystal 3 is grown on the growth face of the SiC single crystal substrate 2.

In this deposition method, nitrogen gas and vapor gas sublimated from Al material are introduced into the reaction crucible with the SiC source gas so that the SiC single crystal is grown with doping nitrogen and Al concurrently. Also in this case, the concentration of nitrogen doped to the SiC single crystal 3 can be controlled to $2 \times 10^{19}$ cm$^{-3}$ or higher and Al is doped to the SiC single crystal with the Al/N ratio within a range of 5% to 40% by controlling a gas flow rate and the pressure of atmospheric gas. The Al/N ratio may also be within a range of 10% to 40%, and the Al/N ratio may also be within a range of 15% to 40%. In this way, the SiC single crystal 3 having the specific resistance demanded for devices and allowing reduction of stacking faults can be obtained.

For example, when the SiC single crystal 3 is grown by the deposition method, source gas including 1.2 SLM of silane and 0.4 SLM of propane is introduced into the reaction crucible. Concurrently, 10 SLM of hydrogen carrier gas, 0.3 SLM of nitrogen gas as nitrogen source and 0.2 SLM of trimethylaluminum (TMA) as Al source are introduced into the reaction crucible. Then the temperature in the vicinity of the raw material 4 is set to approximately 2400° C., the temperature in the vicinity of the SiC single crystal substrate 2 used as the seed crystal is set to approximately 2250° C. and the pressure in the vacuum chamber is set to 50 kPa by controlling the power of heating apparatus and then the growth of SiC single crystal 3 is carried out.

The nitrogen concentration and the Al concentration of the SiC single crystal 3 grown in above-described conditions are respectively $6 \times 10^{19}$ cm$^{-3}$ and $2 \times 10^{19}$ cm$^{-3}$ and the Al/N ratio is 33%. Additionally, the specific resistance is 4 mΩcm. Furthermore, when the SiC single crystal 3 is cut out at an off angle of 4 degrees, and an etch pit density of stacking faults is measured with molten KOH etching, the etch pit density is 17 cm$^{-1}$. When the density of stacking faults generated in a SiC single crystal doped with only nitrogen is measured with the same method described above, the etch pit density is 300 cm$^{-1}$, therefore the stacking faults can be reduced by nearly 95% by doping Al.

Third Embodiment

A third embodiment of the present invention will be described. Because, also in the present embodiment, a manufacturing method of a SiC single crystal 3 is changed from the first embodiment and the other is similar to the first embodiment, only different part will be described.

The SiC single crystal 3 can be also grown by a hot-wall CVD method. In a case where a SiC single crystal 3 is grown by the hot-wall CVD method, a SiC single crystal film is formed as the SiC single crystal 3 on the growth face of the SiC single crystal substrate 2. A growth apparatus (CVD apparatus) of the single crystal film based the hot-wall CVD method is a commonly known technology and is not shown by figure. In the CVD apparatus, a susceptor made of graphite is disposed inside a quartz vacuum chamber. The SiC single crystal 3 (single crystal film) can be epitaxially grown on the growth face of the SiC single crystal substrate 2 by heating the SiC single crystal substrate 2 which is mounted on the susceptor and concurrently introducing SiC source gas and carrier gas into the vacuum chamber through an inlet of the source gas.

In this hot-wall CVD method, nitrogen gas and vapor gas sublimated from Al material are introduced into the reaction crucible with the SiC source gas so that the SiC single crystal 3 is grown with doping nitrogen and Al concurrently. Also in this case, the concentration of nitrogen doped to the SiC single crystal 3 can be controlled to $2 \times 10^{19}$ cm$^{-3}$ or higher and the Al is doped to the SiC single crystal with the Al/N ratio within a range of 5% to 40% by controlling the gas flow rate and the pressure of atmospheric gas. The Al/N ratio may also be within a range of 10% to 40%, and the Al/N ratio may also be within a range of 15% to 40%. In this way, the SiC single crystal 3 having a specific resistance demanded for devices and allowing reduction of stacking faults can be obtained on the surface of the SiC single crystal substrate 2. That is, an epitaxial SiC substrate including the SiC single crystal 3, in which nitrogen is doped at a concentration of $2 \times 10^{19}$ cm$^{-3}$ or higher and the Al/N ratio is within a range of 5% to 40%, is epitaxially grown on a single side of the SiC single crystal substrate 2 can be obtained.

For example, when the SiC single crystal 3 is grown by the hot-wall CVD method, source gas including silane and propane is introduced with hydrogen as carrier gas into the reaction crucible. In addition, nitrogen gas as nitrogen source and trimethylaluminum (TMA) as Al source are also introduced into the reaction crucible. Then the temperature of SiC single crystal substrate 2 is set to approximately 1650° C. and the pressure in the vacuum chamber is set to 10 kPa by controlling the power of heating apparatus and the growth of SiC single crystal 3 is carried out.

The nitrogen concentration and the Al concentration of the SiC single crystal 3 grown in above-described conditions are respectively $2 \times 10^{20}$ cm$^{-3}$ and $5 \times 10^{19}$ cm$^{-3}$ and the Al/N ratio is 28%. Additionally, the specific resistance is 5 mΩcm. Furthermore, when the SiC single crystal is cut out at an off angle of 4 degrees, and an etch pit density of stacking faults is measured with molten KOH etching, the etch pit density is 75 cm$^{-1}$. When the density of stacking faults generated in a SiC single crystal doped with only nitrogen is measured with the same method, the etch pit density is 800 cm$^{-1}$, therefore the stacking faults can be reduced by nearly 90% by doping Al.

Other Embodiments

In each of the above-described embodiments, an example of growing the SiC single crystal 3 by the advanced Rayleigh method, the deposition method or the hot-wall CVD method is described. However, the conditions described in each of the above-described embodiments are merely examples. By changing various growth conditions appropriately, the concentration of nitrogen doped to the SiC single crystal 3 can be controlled to $2\times10^{19}$ cm$^{-3}$ or higher and the Al is doped to the SiC single crystal 3 with the Al/N ratio within a range of 5% to 40%. The Al/N ratio may also be within a range of 10% to 40%, and the Al/N ratio may also be within a range of 15% to 40%.

Also in the second and the third embodiments, a SiC single crystal substrate with a surface of predetermined plane direction having small amount of stacking faults and low specific resistance can be obtained by cutting the SiC single crystal 3 manufactured by each method along the predetermined plane direction as described in the first embodiment. Additionally, a SiC single crystal substrate can be grown using the SiC single crystal substrate manufactured by the above-described way as a new seed crystal.

What is claimed is:

1. A silicon carbide single crystal comprising:
   nitrogen as a dopant; and
   aluminum as a dopant,
   wherein a nitrogen concentration is $2\times10^{19}$ cm$^{-3}$ or higher,
   wherein a ratio of an aluminum concentration to the nitrogen concentration is within a range of 5% to 40%,
   wherein the nitrogen and the aluminum are concurrently doped to the silicon carbide single crystal during a growth of the silicon carbide single crystal, and
   wherein an etch pit density of stacking faults in the silicon carbide single crystal is equal to or lower than 75 cm$^{-1}$.

2. The silicon carbide single crystal according to claim 1, wherein the ratio of the aluminum concentration to the nitrogen concentration is 10% or higher.

3. The silicon carbide single crystal according to claim 1, wherein the ratio of the aluminum concentration to the nitrogen concentration is 15% or higher.

4. The silicon carbide single crystal according to claim 1, wherein the silicon carbide single crystal has a specific resistance of less than or equal to 10 mΩcm.

5. A silicon carbide single crystal having an etch pit density of stacking faults of less than or equal to 75 cm$^{-1}$ prepared by a method comprising:
   growing a silicon carbide single crystal on a surface of a silicon carbide single crystal substrate used as a seed crystal by supplying sublimed gas of a silicon carbide source material to the surface of the silicon carbide single crystal substrate, and
   doping nitrogen and aluminum concurrently to the silicon carbide single crystal during the growing of the silicon carbide single crystal,
   wherein the resulting silicon carbide single crystal has a nitrogen concentration of $2\times10^{19}$ cm$^{-3}$ or higher and a ratio of an aluminum concentration to the nitrogen concentration in a range of 5% to 40%.

6. The silicon carbide single crystal according to claim 5, wherein the silicon carbide single crystal has a specific resistance of less than or equal to 10 mΩcm.

7. A method of manufacturing a silicon carbide single crystal comprising growing a silicon carbide single crystal on a surface of a silicon carbide single crystal substrate used as a seed crystal by supplying sublimed gas of a silicon carbide source material to the surface of the silicon carbide single crystal substrate,
   wherein the growing the silicon carbide single crystal includes doping nitrogen and aluminum concurrently, and
   wherein a nitrogen concentration is $2\times10^{19}$ cm$^{-3}$ or higher and a ratio of an aluminum concentration to the nitrogen concentration is within a range of 5% to 40%.

8. A method of manufacturing a silicon carbide single crystal substrate comprising
   forming a silicon carbide single crystal substrate by cutting the silicon carbide single crystal manufactured by the method according to claim 7.

* * * * *